United States Patent
Cheng et al.

(10) Patent No.: US 10,101,842 B2
(45) Date of Patent: Oct. 16, 2018

(54) METHOD FOR DRIVING TOUCH DISPLAY APPARATUS AND TOUCH DISPLAY APPARATUS

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 157 days.

(21) Appl. No.: 14/408,531

(22) PCT Filed: Apr. 14, 2014

(86) PCT No.: PCT/CN2014/075261
§ 371 (c)(1),
(2) Date: Dec. 16, 2014

(87) PCT Pub. No.: WO2015/096301
PCT Pub. Date: Jul. 2, 2015

(65) Prior Publication Data
US 2016/0266697 A1    Sep. 15, 2016

(30) Foreign Application Priority Data
Dec. 26, 2013    (CN) .......................... 2013 1 0732408

(51) Int. Cl.
| | |
|---|---|
| G06F 3/041 | (2006.01) |
| G06F 3/044 | (2006.01) |
| G02F 1/1333 | (2006.01) |
| G02F 1/1343 | (2006.01) |
| G02F 1/1362 | (2006.01) |
| G02F 1/1368 | (2006.01) |
| G09G 3/34 | (2006.01) |

(Continued)

(52) U.S. Cl.
CPC .......... *G06F 3/0416* (2013.01); *G02F 1/1368* (2013.01); *G02F 1/13338* (2013.01);
(Continued)

(58) Field of Classification Search
CPC ........ G06F 3/044; G06F 3/041; G06F 3/0412; G06F 3/0416; G06F 3/3696; C08F 2/48; G02F 1/1334; G02F 1/13338
See application file for complete search history.

(56) References Cited

U.S. PATENT DOCUMENTS

| | | | |
|---|---|---|---|
| 2009/0009483 A1* | 1/2009 | Hotelling ............... | G06F 3/0416 345/173 |
| 2012/0154326 A1 | 6/2012 | Liu | |

(Continued)

FOREIGN PATENT DOCUMENTS

| | | |
|---|---|---|
| CN | 101315748 A | 12/2008 |
| CN | 101464761 A | 6/2009 |

(Continued)

OTHER PUBLICATIONS

First Office Action regarding Chinese application No. 201310732408.3, dated Jan. 29, 2016. Translation provided by Dragon Intellectual Property Law Firm.

(Continued)

*Primary Examiner* — Robert Michaud
(74) *Attorney, Agent, or Firm* — Harness, Dickey & Pierce, P.L.C.

(57) ABSTRACT

Embodiments of the present disclosure provide a method for driving a touch display apparatus and the touch display apparatus, wherein the quality of the screen display of the touch display apparatus is ensured, by controlling a backlight to be turned on during a first time phase of a time unit, controlling the backlight to be turned off during a second time phase of the time unit, and transmitting, by the chip, a touch driving signal to the touch driving electrodes during a third time phase of the time unit, wherein there is a first relationship between the second time phase and the third time phase.

11 Claims, 4 Drawing Sheets

(51) Int. Cl.
*G09G 3/36* (2006.01)
*H01L 27/32* (2006.01)

(52) U.S. Cl.
CPC .. *G02F 1/133345* (2013.01); *G02F 1/134309* (2013.01); *G02F 1/136286* (2013.01); *G06F 3/044* (2013.01); *G06F 3/0412* (2013.01); *G09G 3/3406* (2013.01); *G09G 3/3413* (2013.01); *G09G 3/3696* (2013.01); *G09G 3/3677* (2013.01); *G09G 3/3688* (2013.01); *G09G 2300/0809* (2013.01); *G09G 2310/08* (2013.01); *H01L 27/323* (2013.01)

(56) References Cited

U.S. PATENT DOCUMENTS

| | | | |
|---|---|---|---|
| 2013/0044074 A1* | 2/2013 | Park | G02F 1/13338 345/174 |
| 2013/0242234 A1* | 9/2013 | Guo | C08F 2/48 349/88 |
| 2013/0314369 A1* | 11/2013 | Liu | G06F 3/0412 345/174 |
| 2015/0035766 A1* | 2/2015 | Chung | G06F 3/0412 345/173 |

FOREIGN PATENT DOCUMENTS

| | | |
|---|---|---|
| CN | 102007446 A | 4/2011 |
| CN | 103150069 A | 6/2013 |
| CN | 103425367 A | 12/2013 |
| CN | 103677427 A | 3/2014 |

OTHER PUBLICATIONS

Written Opinion of the International Searching Authority for international application No. PCT/CN2014/075261.

\* cited by examiner

METHOD FOR DRIVING TOUCH DISPLAY APPARATUS AND TOUCH DISPLAY APPARATUS

CROSS-REFERENCE TO RELATED APPLICATION

This application is the U.S. national phase of PCT Application No. PCT/CN2014/075261 filed on Apr. 14, 2014, which claims priority to Chinese Patent Application No. 201310732408.3 filed on Dec. 26, 2013, the disclosures of which are incorporated in their entirety by reference herein.

TECHNICAL FIELD

An embodiment of the present disclosure relates to the field of display technology, specifically relates to a method for driving a touch display apparatus and a touch display apparatus.

BACKGROUND

Currently, touch panels may be divided into add on mode touch panels, on cell touch panels and in cell touch panels according to composition and structure. For the in cell touch panels, touch electrodes of a touch panel are embedded inside a liquid crystal display screen.

Currently, in the solutions for driving a touch panel, the time division multiplexing technology is a common technology, that is, dividing an original time unit for screen displaying into two parts, wherein during one part of the time unit (i.e. display phase) the touch panel is used for displaying images and during the other part of the time unit (i.e. touch phase) the touch panel is used for implementing touch and detection functions.

In the related art, touch driving signals have some interference on normal display of liquid crystals. As the touch panels are more and more widely used in handheld devices, a demand for low power consumption in the touch panel is also becoming larger and larger. Therefore, the touch driving signal (Tx) is required to have a lower driving frequency during the touch phase. However, lowering the frequency of the touch driving signal will cause the interference on normal display of liquid crystals caused by the touch driving signals to be more obvious, and cause a poor display caused by the interference to be observed more easily.

SUMMARY

Embodiments of the present disclosure provide a method for driving a touch display apparatus and a touch display apparatus, so as to ensure the quality of the screen display of the touch display apparatus.

A solution provided by an embodiment of the present disclosure is as follows.

An embodiment of the present disclosure provides a method for driving a touch display apparatus, the touch display apparatus comprising a touch panel, a chip, touch driving electrodes and a backlight, wherein the method includes:

controlling the backlight to be turned on during a first time phase of a time unit;

controlling the backlight to be turned off during a second time phase of the time unit;

transmitting, by the chip, a touch driving signal to the touch driving electrodes during a third time phase of the time unit, wherein there is a first relationship between the second time phase and the third time phase.

Alternatively, the first relationship is that:
a start time of the second time phase is the same as a start time of the third time phase; and
an end time of the second time phase is the same as an end time of the third time phase.

Alternatively, the first relationship is that:
a start time of the second time phase is the same as a start time of the third time phase; and
an end time of the second time phase is later than an end time of the third time phase.

Alternatively, the first relationship is that:
a start time of the second time phase is earlier than a start time of the third time phase; and
an end time of the second time phase is the same as an end time of the third time phase.

Alternatively, the first relationship is that:
a start time of the second time phase is earlier than a start time of the third time phase; and
an end time of the second time phase is later than an end time of the third time phase.

Alternatively, the time unit is a time of one frame.

Alternatively, the time unit is equal to a sum of a length of the first time phase and a length of the second time phase.

Alternatively, the first time phase is a display phase and the second time phase is a touch phase.

An embodiment of the present disclosure further provides a touch display apparatus, wherein the touch display apparatus is driven by using the method for driving the touch display apparatus provided by the above embodiments of the present disclosure.

Alternatively, the touch panel is an ADS mode liquid crystal screen.

Alternatively, the touch panel includes an upper substrate and a lower substrate, wherein sensing electrodes are provided on the upper substrate, common electrodes and pixel electrodes are provided on the lower substrate and at different layers, and a liquid crystal layer is provided between the sensing electrodes and the common electrodes.

Alternatively, the common electrodes and the pixel electrodes are covered by an insulation layer and a passivation layer respectively.

As can be seen from the above description, the quality of the screen display of the touch display apparatus is ensured in the method for driving the touch display apparatus and the touch display apparatus provided by embodiments of the present disclosure, by controlling the backlight to be turned on during the first time phase of the time unit, controlling the backlight to be turned off during the second time phase of the time unit, and transmitting, by the chip, a touch driving signal to the touch driving electrodes during the third time phase of the time unit, wherein there is the first relationship between the second time phase and the third time phase.

DETAILED DESCRIPTION

In order to make the objectives, technical solutions and advantages of the embodiments of the present disclosure more apparent, technical solutions of embodiments of the present disclosure will be clearly and completely described below in conjunction with the accompany drawings of embodiments of the present disclosure. Obviously, the described embodiments are merely part of embodiments of the present disclosure, but not all embodiments. All other embodiments obtained by a person skilled in the art based on the described embodiments of the present disclosure will fall within the protection scope of the present disclosure.

Unless defined otherwise, technical terms or scientific terms used herein shall have the general meaning understood by a person skilled in the art of the present disclosure. The words "first", "second" and the like used in the description and the claims in the present disclosure do not indicate any order or quantity or importance, but are used to distinguish between different components. Similarly, the words "a" or "an" and the like do not mean the quantity restrictions but indicate the presence of at least one. The words "connect" or "couple" and the like are not limited to physical or mechanical connections, but may include electrical connections no matter directly or indirectly. The words "up", "low", "left", "right" are only used to indicate the relative position relationship, and when the absolute position of the described object is changed, the relative position relationship will be changed accordingly.

Figure 1:
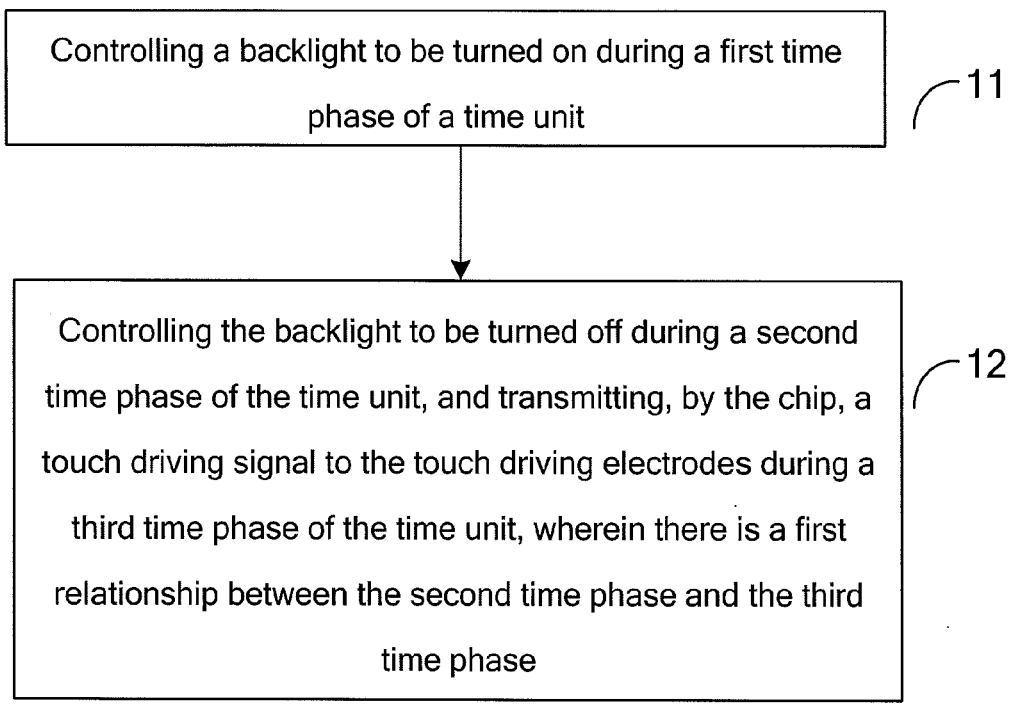
FIG. 1 is a flow diagram showing a method for driving a touch display apparatus according to an embodiment of the present disclosure.

An embodiment of the present disclosure provides a method for driving a touch display apparatus. The touch display apparatus includes a touch panel, a chip, touch driving electrodes and a backlight and other component, as shown in FIG. 1. The method may include:

Step 11, controlling the backlight to be turned on during a first time phase of a time unit;

Step 12, controlling the backlight to be turned off during a second time phase of the time unit; transmitting, by the chip, a touch driving signal to the touch driving electrodes during a third time phase of the time unit, wherein there is a first relationship between the second time phase and the third time phase.

In the method for driving a touch display apparatus provided by an embodiment of the present disclosure, the backlight is turned off temporarily during the second time phase, i.e., a touch phase, which play a role of black insertion, so as to eliminate the interference on the normal display of liquid crystal and the affect on the quality of the screen display caused by touch driving signals during the touch phase, thereby ensuring the quality of the screen display of the touch display apparatus. Moreover, the touch display apparatus may transmit the touch driving signal at a lower frequency during the touch phase; therefore, the power consumption of the touch display apparatus can be reduced.

Liquid crystal molecules have a delay effect in response to the external voltage signals, that is, liquid crystal molecules do not respond to an external signal immediately, but delay by a certain time, which is a response time of liquid crystal. When the touch driving signal is at a high frequency, since the liquid crystal molecules cannot follow the rapidly-changed external electric field, the liquid crystal molecules maintain the original arrangement, so that the high frequency touch driving signal has not much effect on an arrangement state of the liquid crystal molecules in a displaying state, that is, the high frequency touch driving signal has a small interference on the normal display of liquid crystal. When the touch driving signal is at a low frequency, the arrangement of the liquid crystal molecules will be changed when the touch driving signal is changed, so that the display state will be changed, which causes a large interference on the normal display of liquid crystal and an obvious affect on the quality of the screen display.

Therefore, in the method for driving the touch display apparatus provided by an embodiment of the present disclosure, the backlight is turned off during the touch phase, so that the interference on liquid crystal's display state caused by touch driving signals cannot be observed by the human eyes, so as to eliminate the interference on the normal display of liquid crystal and the affect on the quality of the screen display caused by touch driving signals during the touch phase, especially by low frequency touch driving signals. In this way, it can be achieved that a low frequency touch driving signal may be used in the touch display apparatus during the touch phase, for detecting a touch operation, so that in a case of using the low frequency (e.g., several tens of Hertz to several hundreds of Hertz) touch driving signal, the quality of the screen display of the touch display apparatus can be ensured and the power consumption of the touch display apparatus can be reduced.

The quality of the screen display of the touch display apparatus can be ensured in a case where a frequency of the touch driving signal is several hundreds of Hertz or even tens of Hertz, by the method for driving the touch display apparatus provided by an embodiment of the present disclosure.

In a specific embodiment of the present disclosure, in order to ensure that the backlight has been turned off already when the chip transmits touch driving signals to the touch driving electrodes, the first relationship between a time phase when the backlight is turned off, i.e., the second time phase, and a time phase when the chip transmits the touch driving signals, i.e., the third time phase may be predetermined.

In a particular embodiment, the above-described first relationship may specifically be as follows:

a start time of the second time phase is the same as a start time of the third time phase;

an end time of the second time phase is the same as an end time of the third time phase.

In another specific embodiment, the above-described first relationship may also specifically be as follows:

the start time of the second time phase is the same as the start time of the third time phase;

the end time of the second time phase is later than the end time of the third time phase.

Further, the above-described first relationship may also specifically be as follows:

the start time of the second time phase is earlier than the start time of the third time phase;

the end time of the second time phase is the same as the end time of the third time phase.

Further, the above-described first relationship may also specifically be as follows:

the start time of the second time phase is earlier than the start time of the third time phase;

the end time of the second time phase is later than the end time of the third time phase.

In summary, in the embodiment of the present disclosure, it needs to be ensured that the backlight has already been turned off when the chip transmits the touch driving signal to the touch driving electrodes, so as to eliminate the interference on the normal display of liquid crystal and the affect on the quality of the screen display caused by the touch driving signal, especially by the low frequency (e.g., several tens of Hertz to several hundreds of Hertz) touch driving signal.

The time unit may be a time of one frame or other time unit.

Moreover, a length of the time unit may be equal to a sum of a length of the aforementioned first time phase and a length of the second time phase. Further, if the touch display apparatus has other function phases within the time unit, the length of the time unit may be greater than the sum of the length of the first time phase and the length of the second time phase.

When the time division multiplexing driving method is used in the touch display apparatus, the touch display apparatus may be in a display phase and the touch phase. Therefore, the first time phase may be the display phase while the second time phase may be the touch phase.

A specific application process of the method for driving the touch display apparatus is described in detail with an example where the touch display apparatus is an advanced super dimension switch (ADSDS, referred to ADS) mode liquid crystal display, i.e., an in cell touch display apparatus.

Figure 4:
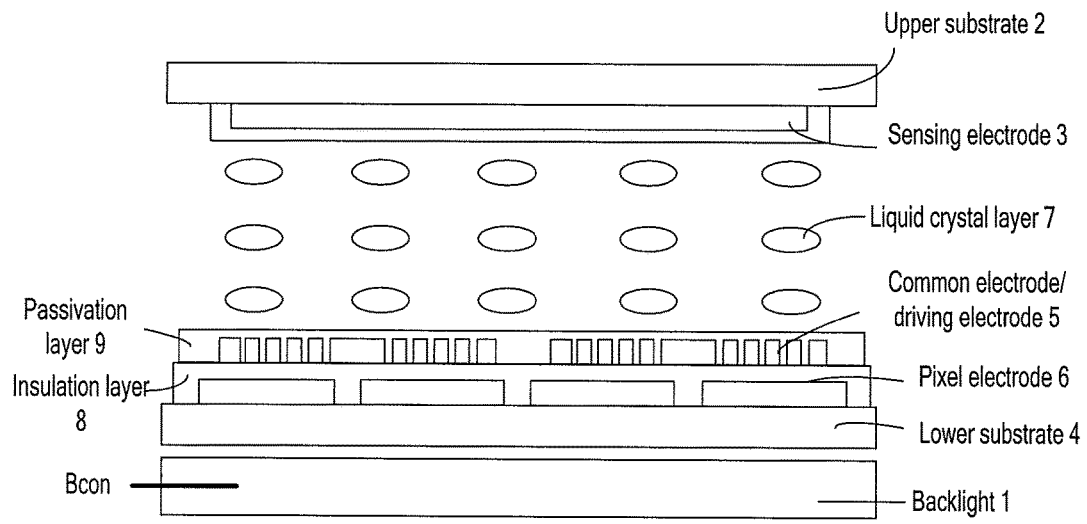
FIG. 4 is yet another schematic diagram showing a structure of a touch display apparatus according to an embodiment of the present disclosure.

The in cell touch display apparatus may include an ADS mode liquid crystal screen, a backlight 1, as shown in FIG. 4. The ADS mode liquid crystal screen is an in cell capacitive touch display screen. The backlight 1 is connected to a backlight control signal (Bcon). When the backlight control signal is at a high level, the backlight 1 is turned on; when the backlight control signal is at a low level, the backlight 1 is turned off.

The ADS mode liquid crystal display implements the display function and touch function in different time phases, that is, in the ADS mode liquid crystal display, the backlight 1 is turned on during the first time phase of the time unit (such as a frame) and the backlight 1 is turned off during the second time phase of the time unit.

Figure 2:
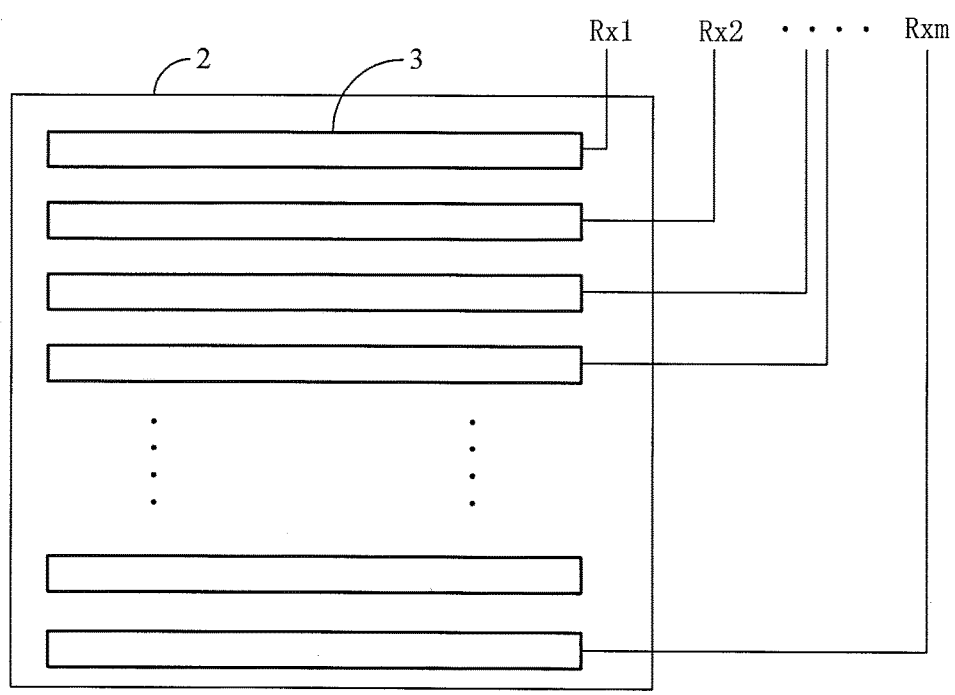
FIG. 2 is a schematic diagram showing a structure of a touch display apparatus according to an embodiment of the present disclosure.

In the embodiment, firstly, strip-shaped sensing electrodes 3 can be prepared on an upper substrate 2 of the ADS mode liquid crystal display (as shown in FIG. 2). The sensing electrodes 3 are connected to sensing signal lines (Rx). Common electrodes 5 and pixel electrodes 6 are prepared on a lower substrate 4. A liquid crystal layer 7 is sandwiched between sensing electrodes 3 and common electrodes 5. Common electrodes 5 and pixel electrodes 6 are prepared in different layers, and covered by an insulation layer 8 and a passivation layer 9, respectively. During the display phase, the display function can be achieved by common electrodes 5 and pixel electrodes 6. And during the touch phase, a mutual capacitance can be formed by the common electrodes 5, as driving electrodes, and strip-shaped sensing electrodes 3 on the upper substrate 2. FIG. 4 shows a schematic view of a layer structure of the ADS liquid crystal display according to an embodiment of the present disclosure.

Figure 3:
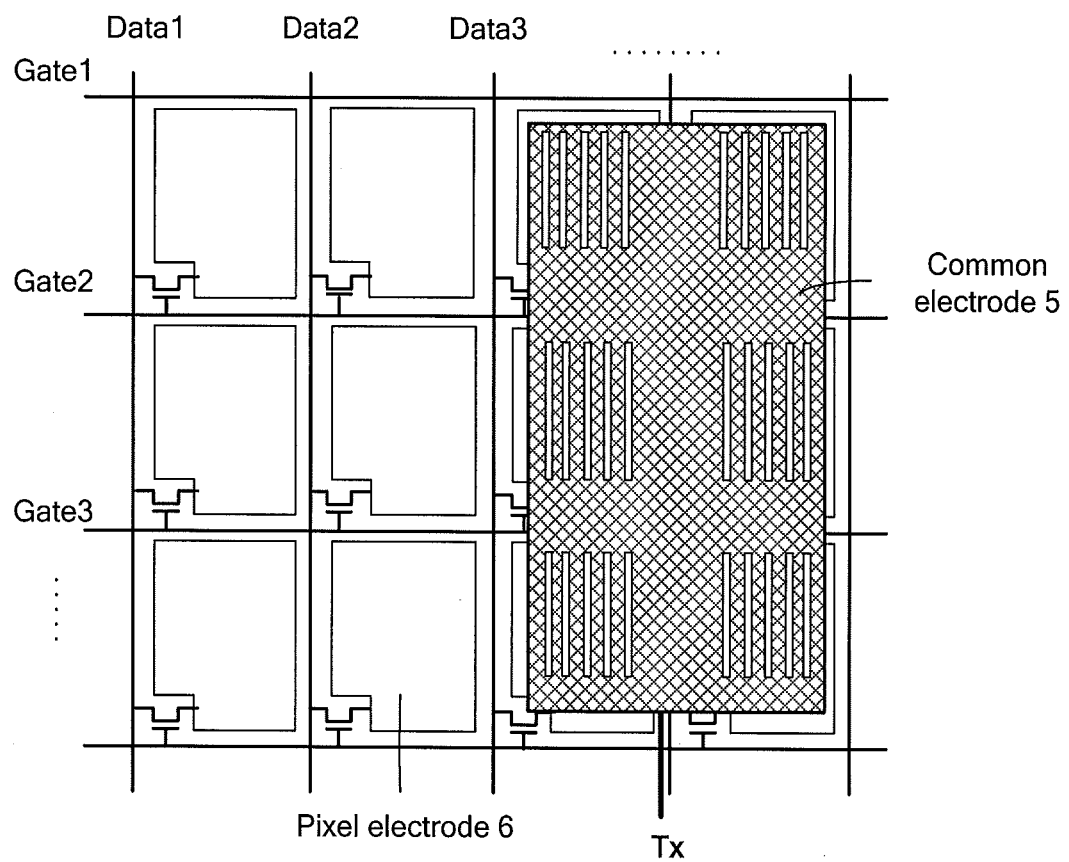
FIG. 3 is another schematic diagram showing a structure of a touch display apparatus according to an embodiment of the present disclosure.

In the embodiment, the common electrodes 5 can be divided and worked as driving electrodes. For example, common electrodes corresponding to two columns of the pixel electrodes 6 may be selected as one driving electrode, to be connected with a touch driving signal line Tx, as shown in FIG. 3. There are a plurality of gate lines Gate1, Gate2, Gate3 . . . and a plurality of data lines Data1, Data 2, Data3 . . . on the lower substrate 4 (not shown in the figure). The pixel electrodes 6 are located at intersections of gate lines and data lines, and connected with data lines through thin film transistors, gate electrodes of the thin film transistors are connected with the gate lines corresponding to the thin film transistors. And there is the insulation layer 8 between the pixel electrodes 6 and the common electrodes 5.

Figure 5:
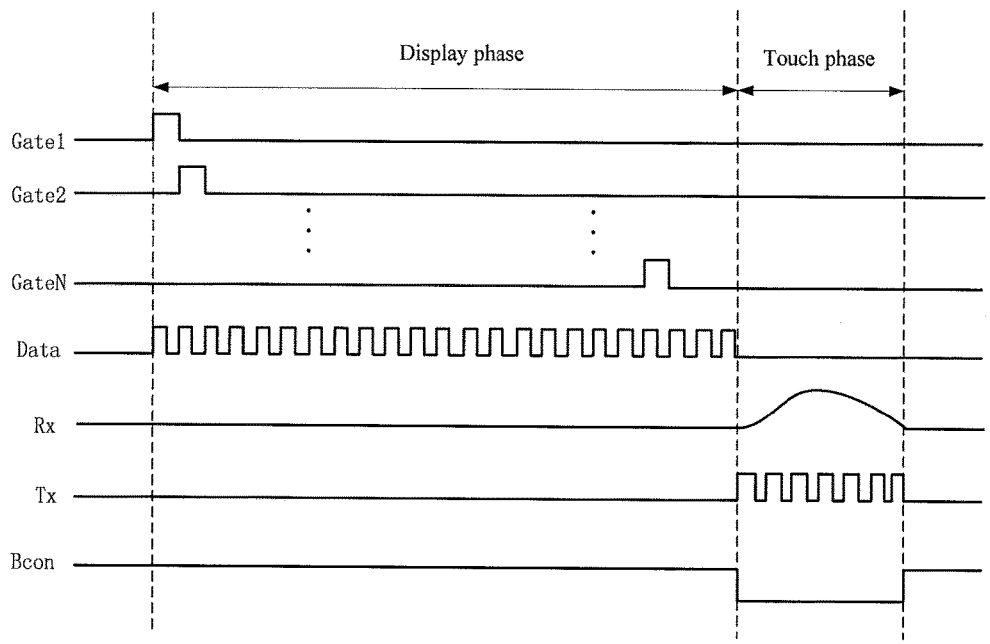
FIG. 5 is schematic diagram showing a time division multiplexing waveform involved in a method for driving a touch display apparatus according to an embodiment of the present disclosure.

FIG. 5 shows a time division multiplexing waveform diagram involved in the method for driving a touch display apparatus according to an embodiment of the present disclosure. It can be explained with examples. For example, time for the touch display apparatus to display a frame is 16.7 ms, in which 4 ms is the touch phase and the other 12.7 ms is the display phase. The lengths of the two time phase may also be appropriately adjusted according to a processing capability of the IC chip, and are not specifically limited herein. Gate lines Gate 1, Gate 2 . . . Gate N are sequentially enabled in the display phase; the data lines Data output display data during the display phase; and the backlight control signal Bcon is at a high level during the display phase, so that the touch display apparatus can implement the display function.

During the 4 ms of the touch phase, the backlight control signal Bcon is at a low level and at this time the backlight is turned off. When the touch driving signal is applied to touch driving electrodes via the touch driving signal line Tx, a voltage signal coupled in the touch sensing signal line Rx by an inductive capacitance is detected. Typically, the driving signals during the touch phase have some interference on the normal display of the liquid crystal and a poor display may occur. At this time, the backlight is needed to be turned off temporarily for black insertion, so as to eliminate the affect on the quality of the screen display during the touch phase. The disclosure particularly aims to eliminate the affect on the quality of the screen display caused by a low frequency driving signal. The frequency of the touch driving signal may be as low as several tens of Hertz to several hundreds of Hertz, which can greatly reduce the power consumption required by the touch function and can be of great help to extend the charging intervals of mobile products.

The specific touch principle involved in the embodiment of the present disclosure is as follows. When the touch driving signal is applied to touch driving electrode 5 via the touch driving signal line Tx, the voltage signal coupled in the touch sensing signal line Rx by the inductive capacitance is detected; during this process, if the touch screen is touched by a human body, the electric field of the human body acts on the inductive capacitor, which changes the capacitance value of the inductive capacitor, thereby changing the voltage signal coupled in the touch sensing signal line; a touch position can be determined based on the changes in the voltage signal.

An embodiment of the present disclosure further provides a touch display apparatus, wherein the touch display apparatus may be driven by using the method for driving the touch display apparatus provided by the above-described embodiment of the present disclosure.

In the above-described embodiment, the technical solutions has been described in detail with an example where the touch display screen involved in the present disclosure is an ADS mode liquid crystal display. However, it should be noted that, the touch display apparatus involved in an embodiment of the present disclosure is not limited to the ADS mode liquid crystal display but also includes touch display apparatuses of a twisted nematic (TN) mode, vertical alignment mode (VA) and other modes.

Further, the touch display apparatus involved in an embodiment of the present disclosure also includes a touch organic light-emitting diode (OLED) display apparatus, and the quality of the screen display of the touch OLED display apparatus can be ensured during the touch phase by turning off the OLED during the touch phase.

Meanwhile, the method for driving a touch display apparatus can also be used in touch display apparatuses of add on mode, on cell mode, in cell mode and other modes.

As can be seen from the above description, the quality of the screen display of the touch display apparatus is ensured in the method for driving the touch display apparatus and the touch display apparatus provided by embodiments of the present disclosure, by controlling the backlight to be turned on in the first time phase of the time unit, controlling the backlight to be turned off in the second time phase of the time unit, and transmitting, by the chip, touch driving signal to the touch driving electrodes in the third time phase of the time unit, wherein there is the first relationship between the second time phase and the third time phase.

The above descriptions are only alternative embodiments of the present disclosure. It should be noted that, improvements and modifications may be made for those skilled in the art without departing from the principles of the present disclosure, and should also be considered to fall within the protection scope of the disclosure.

What is claimed is:

1. A method for driving a touch display apparatus, the touch display apparatus comprising a chip, a backlight, and an ADS mode liquid crystal screen comprising an upper substrate and a lower substrate, wherein the method comprises:
    controlling the backlight to be turned on during a first time phase of a time unit;
    controlling the backlight to be turned off during a second time phase of the time unit; and
    transmitting, by the chip, a low-frequency touch driving signal to a plurality of common electrodes arranged on the lower substrate during a third time phase of the time unit,
    wherein a start time of the second time phase is the same as a start time of the third time phase, and an end time of the second time phase is later than an end time of the third time phase.

2. The method according to claim 1, wherein the time unit is a time of one frame.

3. The method according to claim 1, wherein the time unit is equal to a sum of a length of the first time phase and a length of the second time phase.

4. The method according to claim 1, wherein the first time phase is a display phase and the second time phase is a touch phase.

5. A touch display apparatus, wherein the touch display apparatus is driven by using the method for driving the touch display apparatus according to claim 1.

6. The touch display apparatus according to claim 5, wherein the common electrodes and pixel electrodes provided on the lower substrate are covered by an insulation layer and a passivation layer respectively.

7. The touch display apparatus according to claim 5, wherein the time unit is a time of one frame.

8. The touch display apparatus according to claim 7, wherein the time unit is equal to a sum of a length of the first time phase and a length of the second time phase.

9. The touch display apparatus according to claim 5, wherein the first time phase is a display phase and the second time phase is a touch phase.

10. The method according to claim 2, wherein the time unit is greater than a sum of a length of the first time phase and a length of the second time phase.

11. The touch display apparatus according to claim 7, wherein the time unit is greater than a sum of a length of the first time phase and a length of the second time phase.

* * * * *